(12) United States Patent
Park et al.

(10) Patent No.: US 11,315,872 B1
(45) Date of Patent: Apr. 26, 2022

(54) SELF-ALIGNED TOP VIA

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Shatin (CN); Kisik Choi, Watervliet, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/117,186

(22) Filed: Dec. 10, 2020

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76816* (2013.01); *H01L 21/76877* (2013.01); *H01L 23/53266* (2013.01)

(58) Field of Classification Search
CPC ............... H01L 23/485; H01L 23/5226; H01L 23/53266; H01L 21/76816; H01L 21/76877
See application file for complete search history.

(56) References Cited

U.S. PATENT DOCUMENTS

| 8,357,609 | B2 | | 1/2013 | Ryan | |
|---|---|---|---|---|---|
| 9,059,001 | B2 | * | 6/2015 | Liu | ..................... H01L 21/3086 |
| 9,177,797 | B2 | * | 11/2015 | Chang | .................. H01L 21/0338 |
| 9,601,426 | B1 | | 3/2017 | Bonilla et al. | |
| 9,613,861 | B2 | | 4/2017 | Anderson et al. | |
| 9,646,883 | B2 | | 5/2017 | Brink et al. | |
| 9,761,489 | B2 | | 9/2017 | Mebarki et al. | |
| 9,852,986 | B1 | * | 12/2017 | Stephens | ........... H01L 21/76816 |
| 9,984,919 | B1 | | 5/2018 | Zhang et al. | |
| 11,139,202 | B2 | * | 10/2021 | Park | .................. H01L 21/76897 |
| 2001/0004012 | A1 | * | 6/2001 | Jin | .......................... F28F 1/325 |
| | | | | | 165/151 |
| 2012/0068346 | A1 | | 3/2012 | Ponoth | |
| 2015/0056800 | A1 | * | 2/2015 | Mebarki | .......... H01L 21/32139 |
| | | | | | 438/666 |
| 2016/0197011 | A1 | | 7/2016 | Bristol et al. | |
| 2017/0040216 | A1 | | 2/2017 | Anderson | |

(Continued)

FOREIGN PATENT DOCUMENTS

WO    2019089045 A1    5/2019

*Primary Examiner* — Jaehwan Oh
*Assistant Examiner* — John M Parker
(74) *Attorney, Agent, or Firm* — Edward J. Wixted, III

(57) ABSTRACT

Embodiments of the invention include a method for fabricating a semiconductor device and the resulting structure. Mandrels are patterned on a liner, where the liner is located on a semiconductor substrate. Spacers are formed on sidewalls of the mandrels. Dielectric material lines are formed on exposed surfaces of the liner and within a plurality of gaps between the spacers. The mandrels are removed. The at least one of the dielectric material lines are removed from within at least one of the plurality of gaps between the spacers. Conductive metal is formed within each gap. The conductive metal is patterned to form metal interconnect lines and vias. The plurality of spacers and the remaining dielectric material lines are removed.

14 Claims, 8 Drawing Sheets

(56) References Cited

U.S. PATENT DOCUMENTS

| | | |
|---|---|---|
| 2019/0206733 A1 | 7/2019 | Lin et al. |
| 2020/0027782 A1 | 1/2020 | Jiang |
| 2020/0343101 A1 | 10/2020 | Jin |
| 2020/0350206 A1 | 11/2020 | Ren |
| 2021/0313264 A1 | 10/2021 | Park |
| 2021/0335666 A1 | 10/2021 | Park |

* cited by examiner

SELF-ALIGNED TOP VIA

BACKGROUND

The present invention relates generally to the field of semiconductor structures and fabrication, and more particularly to the fabrication of a top via and metal interconnect line structure.

Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections.

A via is an electrical connection between layers in a physical electronic circuit that goes through the plane of one or more adjacent layers. In integrated circuit design, a via is a small opening in an insulating oxide layer that allows a conductive connection between different layers.

Damascene processing is an additive process where a dielectric is deposited, the dielectric is etched according to a defined pattern, metal is filled according to the pattern, and excess metal is removed by chemical-mechanical polishing/planarization (CMP).

SUMMARY

Embodiments of the invention include a method for fabricating a semiconductor device and the resulting structure. The method can include patterning mandrels on a liner, where the liner is located on a semiconductor substrate. The method can also include forming spacers on sidewalls of the mandrels. The method can also include forming dielectric material lines on exposed surfaces of the liner and within a plurality of gaps between the spacers. The method can also include removing the mandrels. The method can also include removing at least one of the dielectric material lines within at least one of the plurality of gaps between the spacers. The method can also include forming conductive metal within each gap. The method can also include patterning the conductive metal to form metal interconnect lines and vias. The method can also include removing the plurality of spacers and the remaining dielectric material lines.

Embodiments of the invention may additional include alternate methods for fabricating a semiconductor device and the resulting structure. The method can include providing a dielectric layer located on a surface of a liner, wherein the liner is located on a surface of a semiconductor substrate. The method can also include forming a plurality of trenches of a depth that exposes a surface of the liner and creates dielectric material lines from the remaining dielectric layer. The method can also include forming spacers on sidewalls of the dielectric material lines. The method can also include removing at least one of the dielectric material lines that is between two of the spacers. The method can also include forming conductive metal within each present gap. The method can also include patterning the conductive metal to form metal interconnect lines and vias. The method can also include removing the plurality of spacers and the remaining dielectric material lines.

DETAILED DESCRIPTION

Figure 1:
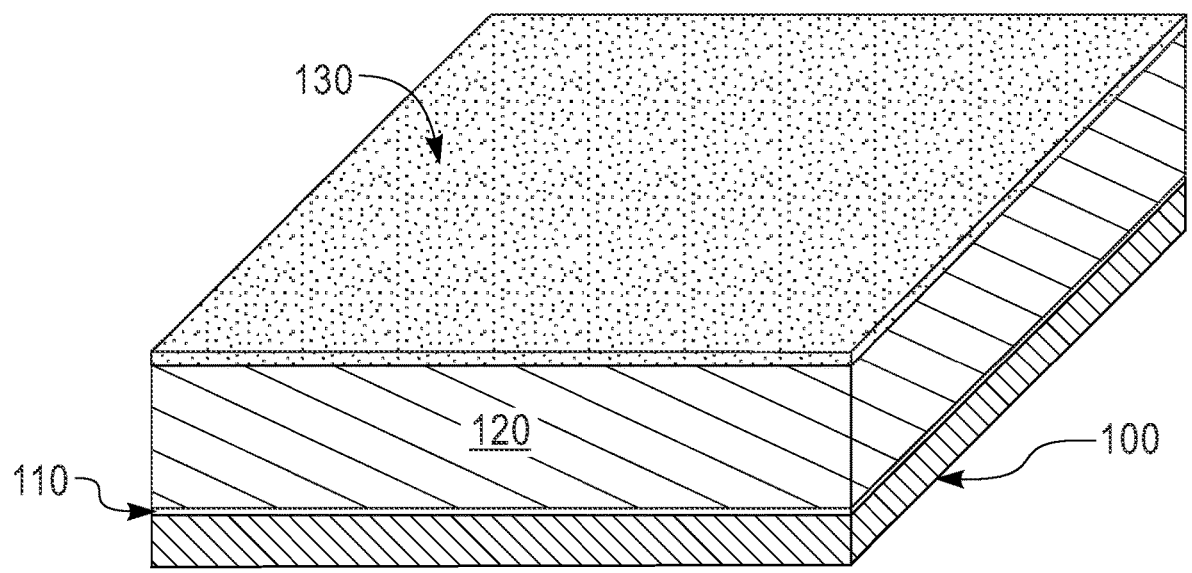
FIG. 1 depicts a semiconductor substrate and stack comprising a liner, dielectric layer, and hardmask, in accordance with an embodiment of the invention.

Embodiments of the present invention describe a method to form a self-aligned back end of line (BEOL) metal line and top via structure and the resulting structure. Embodiments of the present invention recognize that conductive metal is optically opaque and can cause alignment and overlay challenges. Thick conductive metals can cause high stress resulting in wafer warpage. Further, embodiments of the present invention recognize that subtractive etching of thick metal can cause bad line edge roughness, mouse biting, or other issues. Embodiments of the present invention recognize that damascene techniques may improve line edge roughness when compared to subtractive patterning, but can cause line wiggling issues. Accordingly, embodiments of the present invention describe an approach that forms metal interconnect lines via damascene and vias by subtractive etching processes, resulting in structures where both metal interconnect lines and vias are self-aligned. Further, embodiments of the present invention recognize that such an approach does not require scaffolds, as the utilized spacers act as a scaffold and is removed after the top via formation.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention will now be described in detail with reference to the Figures.

FIG. 1 depicts an isometric view of a device at an early stage in the method of forming the device. The semiconductor structure of FIG. 1 incudes a semiconductor material stack comprising hardmask 130, on a surface of dielectric layer 120, on a surface of liner 110, on a surface of semiconductor substrate 100.

Semiconductor substrate 100 may be composed of a silicon containing material. Silicon containing materials include, but are not limited to, silicon, single crystal silicon, polycrystalline silicon, SiGe, single crystal SiGe, polycrystalline SiGe, or silicon doped with carbon (Si:C), amorphous silicon, and combinations and multi-layers thereof. Semiconductor substrate 100 can also be composed of other semiconductor materials, such as germanium (Ge), and compound semiconductor substrates, such as type III/V semiconductor substrates, e.g., gallium arsenide (GaAs). Semiconductor substrate 100 may be, in some embodiments, wafers with front-end-of-line (FEOL), middle-of-the-line (MOL), and/or BEOL metals. In general, semiconductor substrate 100 is a smooth surface substrate.

Liner 110 is formed by sputtering, chemical vapor deposition (CVD), or atomic layer deposition (ALD) and is a conductor such as titanium nitride (TiN) or tantalum nitride (TaN). In some embodiments, liner 110 may be comprised of other conductive materials such as aluminum (AL), copper (Cu), nickel (Ni), cobalt (Co), ruthenium (Ru), titanium (Ti), tantalum (Ta), or combinations thereof.

Dielectric layer 120 is deposited on top of liner 110. Dielectric layer 120 is generally a layer of insulating material. Dielectric layer 120 can be composed of, for example, silicon nitride (SiN), silicon carbonitride (SiCN), (SiOCN), (SiBCN), or other insulating materials known in the art. Dielectric layer 120 is deposited such that dielectric layer 120 has a thickness corresponding to the combined desired height of the via and metal line of the eventual resulting device.

Hardmask 130 is deposited on top of dielectric layer 120. A hardmask is a material used in semiconductor processing as an etch mask. Hardmask 130 is composed of metal or a dielectric material such as, for example, SiN, silicon oxide, or a combination of silicon nitride and silicon oxide which may be deposited using, for example, a process such as low pressure chemical vapor deposition (LPCVD). In various embodiments, standard photolithographic processes are used to define a pattern of hardmask 130 in a layer of photoresist (not shown) deposited on hardmask 130. The desired hardmask pattern may then be formed in hardmask 130 by removing hardmask 130 from the areas not protected by the pattern in the photoresist layer. Hardmask 130 is removed using, for example, reactive ion etching (ME). ME uses chemically reactive plasma, generated by an electromagnetic field, to remove various materials. A person of ordinary skill in the art will recognize that the type of plasma used will depend on the material of which hardmask 130 is composed, or that other etch processes such as wet chemical etching or laser ablation may be used. While not depicted, hardmask 130 maybe patterned such that hardmask 130 covers the area of dielectric layer 120 that becomes mandrels 210 (see FIG. 2).

Figure 2:
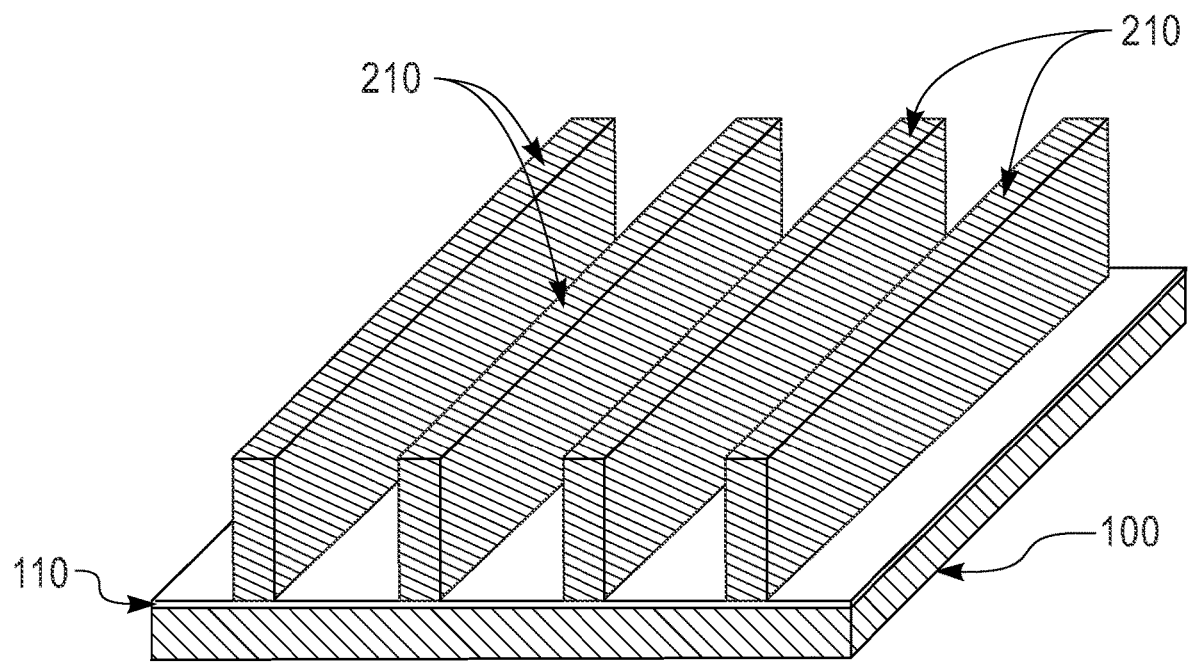
FIG. 2 depicts a process of forming mandrels from the dielectric layer of the stack, in accordance with an embodiment of the invention.

FIG. 2 depicts an isometric view of fabrication steps, in accordance with an embodiment of the present invention. FIG. 2 shows the formation of mandrels 210 from dielectric layer 120 and the removal of hardmask 130. Mandrels are used in spacer patterning. Spacer patterning is a technique employed for patterning features with linewidths smaller than can be achieved by conventional lithography. In general, a spacer (e.g., spacers 310, see FIG. 3) is deposited over the mandrel (e.g., mandrels 210), and the mandrel is a pre-patterned feature. The spacer is subsequently etched back so that the spacer portion covering the mandrel is etched away while the spacer portion on the sidewall remains. The mandrel may then be removed, leaving two spacers (one for each edge) for each mandrel.

Mandrels 210 may be formed by an etching process, such as ME, laser ablation, or any etch process which can be used to selectively remove a portion of material such as dielectric layer 120. As described above with reference to FIG. 1, hardmask 130 may be patterned to cover mandrels 210 and utilized during the etching process in the creation of mandrels 210. The etching process only removes the portions of dielectric layer 120 not protected by hardmask 130 and the etching process stops at liner 110. Each of the mandrels have a height equal to the combined height of the desired metal line and via heights.

In some embodiments, subsequent to the formation of mandrels 210, hardmask 130 is removed. In general, the process of removing hardmask 130 involves the use of an etching process such as RIE, laser ablation, or any etch process which can be used to selectively remove a portion of material, such as hardmask 130. In alternate embodiments, hardmask 130 may not be removed at this time and remains on the device until a later metal chemical mechanical polishing/planarization (CMP) step (see FIG. 7) is performed.

Figure 3:
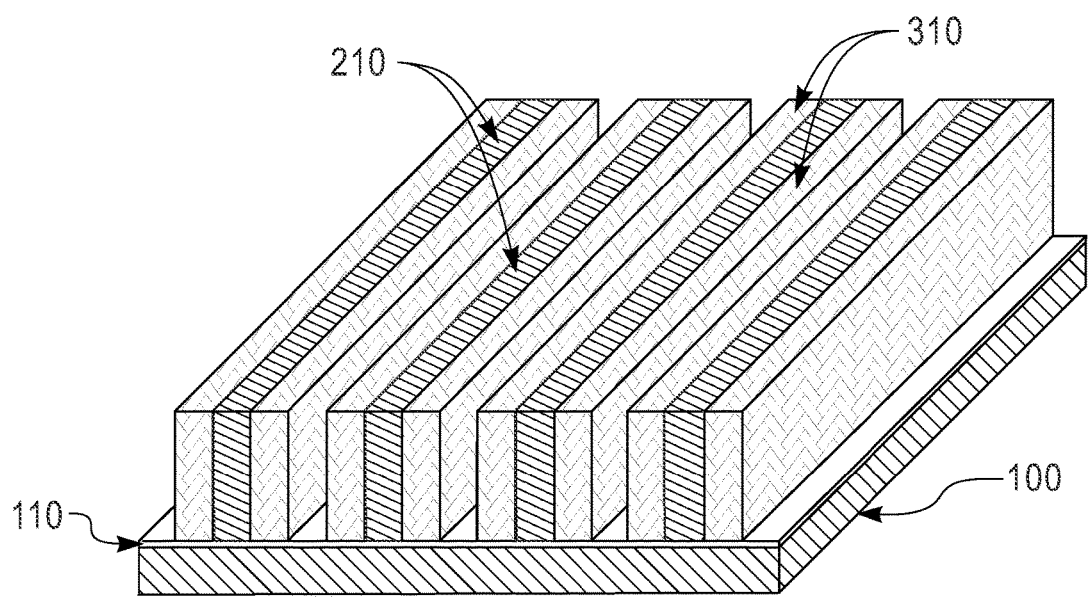
FIG. 3 depicts a process of forming spacers on sidewalls of the mandrels, in accordance with an embodiment of the invention.

FIG. 3 depicts an isometric view of fabrication steps, in accordance with an embodiment of the present invention. FIG. 3 shows the formation of spacers 310 on the exposed sides of mandrels 210. Spacers 310 are composed of metal (e.g., TiN, TaN) or any dielectric spacer material including, for example, a dielectric oxide, dielectric nitride, and/or dielectric oxynitride. In some embodiments, spacers 310 are composed of a non-conductive low-capacitance dielectric material such as silicon dioxide ($SiO_2$). In general, spacers 310 are composed of a material different from liner 110. The process of forming spacers 310 may include depositing a conformal layer (not shown) of insulating material, such as silicon nitride, over exposed surfaces of liner 110 and mandrels 210. Spacers 310 can be deposited using, for example CVD, plasma enhanced chemical vapor deposition (PECVD), physical vapor deposition (PVD), or other deposition processes. An anisotropic etch process, where the etch rate in the forward direction is greater than the etch rate in the lateral directions, may be used to remove portions of the insulating layer, thereby forming spacers 310 located on the sidewalls of mandrels 210, as depicted in FIG. 3.

Figure 4:
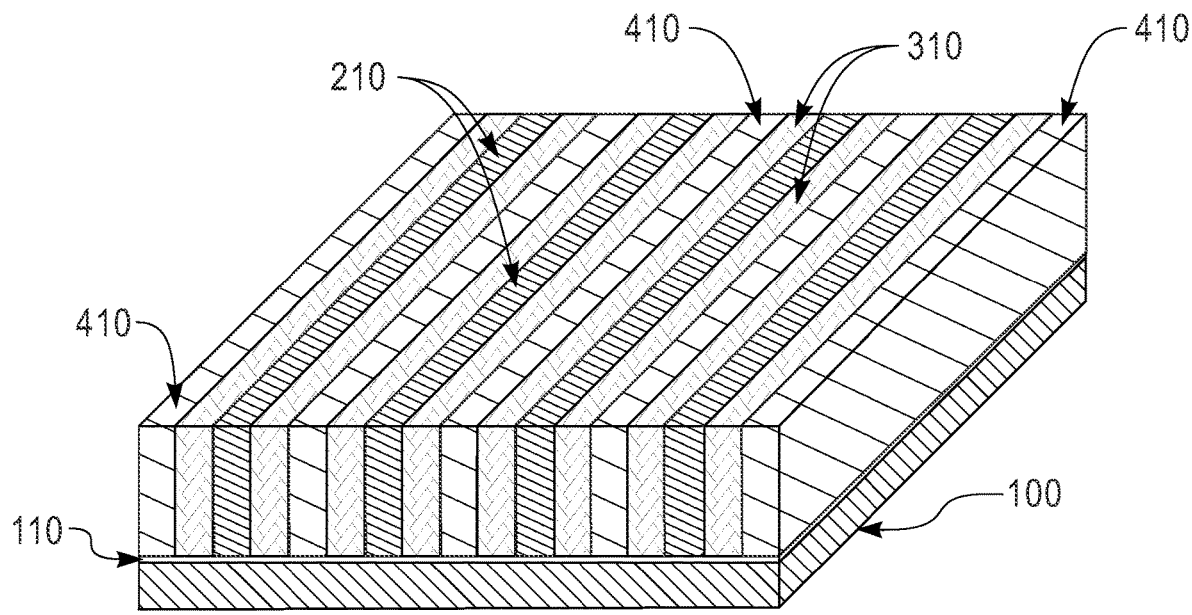
FIG. 4 depicts a process of forming a dielectric layer within the exposed gaps between the spacers, in accordance with an embodiment of the invention.

FIG. 4 depicts an isometric view of fabrication steps, in accordance with an embodiment of the present invention. FIG. 4 shows the formation of dielectric layer 410 on liner 110 and within the exposed gaps between spacers 310. Portions of dielectric layer 410 within each of the exposed gaps may create a plurality of dielectric material lines. As described above with reference to dielectric layer 120, dielectric layer 410 is generally a layer of insulating material and may be composed of, for example, SiN, SiCN, SiOCN, SiBCN, or other insulating materials known in the art. In some embodiments, dielectric layer 410 is a layer of low-κ dielectric material. Low-κ is a material with a small relative dielectric constant (κ) relative to $SiO_2$. Low-κ materials include, for example, fluorine-doped $SiO_2$, organosilicate glass (OSG), porous $SiO_2$, porous organosilicate glass, spin-on organic polymeric dielectrics, and spin-on silicon based polymeric dielectrics. In some embodiments, dielectric layer 410 is spin-on-glass. Spin-on-glass is an interlayer dielectric material applied in liquid form to fill narrow gaps in the sub-dielectric surface. In some embodiments, dielectric layer 410 is deposited using flowable chemical vapor deposition (fCVD) or spin-on dielectric methods. Dielectric layer 410 may be created by depositing dielectric layer 410 above the desired height and then utilizing a planarization process, such as CMP, to reduce the height of dielectric layer 410 such that the top surface of mandrels 210 are exposed.

Figure 5:
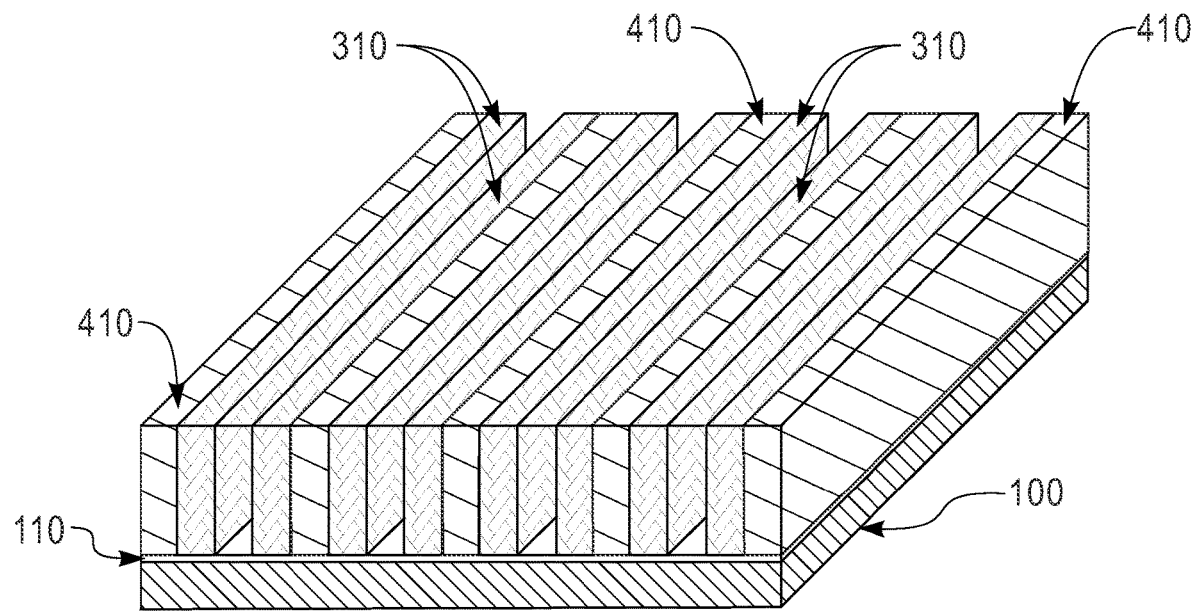
FIG. 5 depicts a process of removing the mandrels, in accordance with an embodiment of the invention.

FIG. 5 depicts an isometric view of fabrication steps, in accordance with an embodiment of the present invention. FIG. 5 shows the removal of mandrels 210 to create a first trench within the gaps depicted of FIG. 5. Mandrels 210 may be removed using an etching process that is selective in removing physically exposed portions of mandrels 210 relative to spacers 310 and dielectric layer 410 to create the gaps that comprise the first trench. The etching process utilized may be a dry etching or wet etching process.

Figure 6:
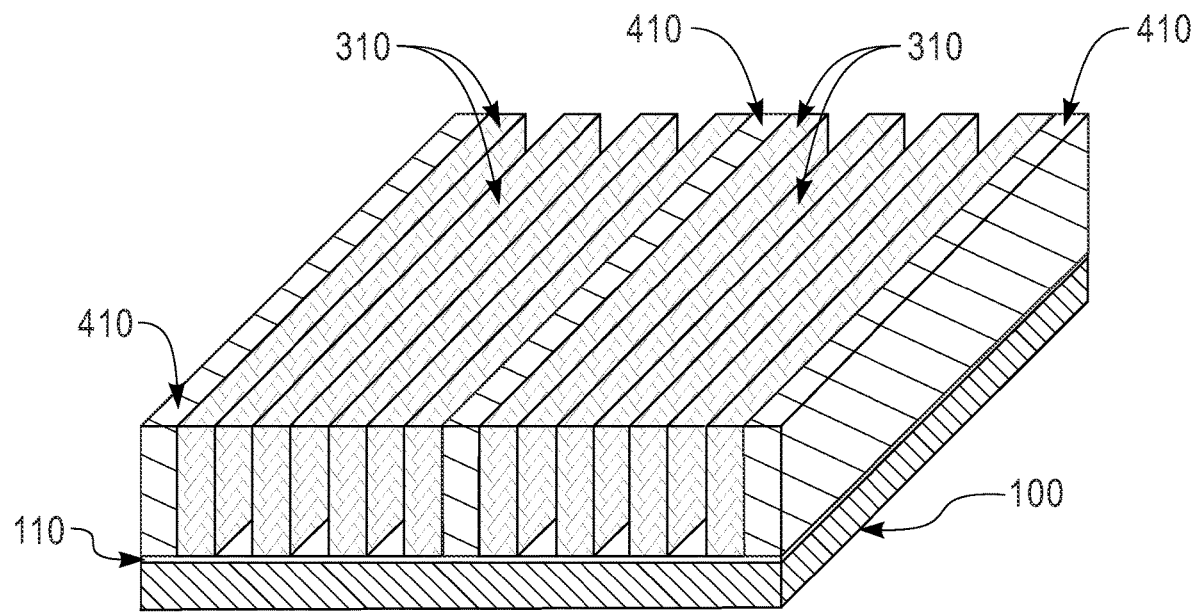
FIG. 6 depicts a process of removing dielectric material lines, in accordance with an embodiment of the invention.

FIG. 6 depicts an isometric view of fabrication steps, in accordance with an embodiment of the present invention. FIG. 6 shows the removal of portions of dielectric layer 410 to create a second trench. One or more dielectric material lines may be removed. In the depicted embodiment, the middle and end portions of dielectric layer 410 are not removed. The portion of dielectric layer 410 that are removed may be removed by the use of a standard photolithographic process to define the desired shape of the second trench in a layer of photoresist (not shown) deposited on the top surface of spacers 310, dielectric layer 410, and/or liner 110. In various embodiments, standard photolithographic processes are used to remove a portion of the photoresist layer corresponding to the areas of dielectric layer which are to be removed in the formation of the second trench. The portion or dielectric layer 410 may be removed using, for example, a dry etch process such as RIE to remove the desired portion(s) of dielectric layer 410. As a result of etching the portions of dielectric layer 410, liner 110 is exposed in the area defined as the second trench.

Figure 7:
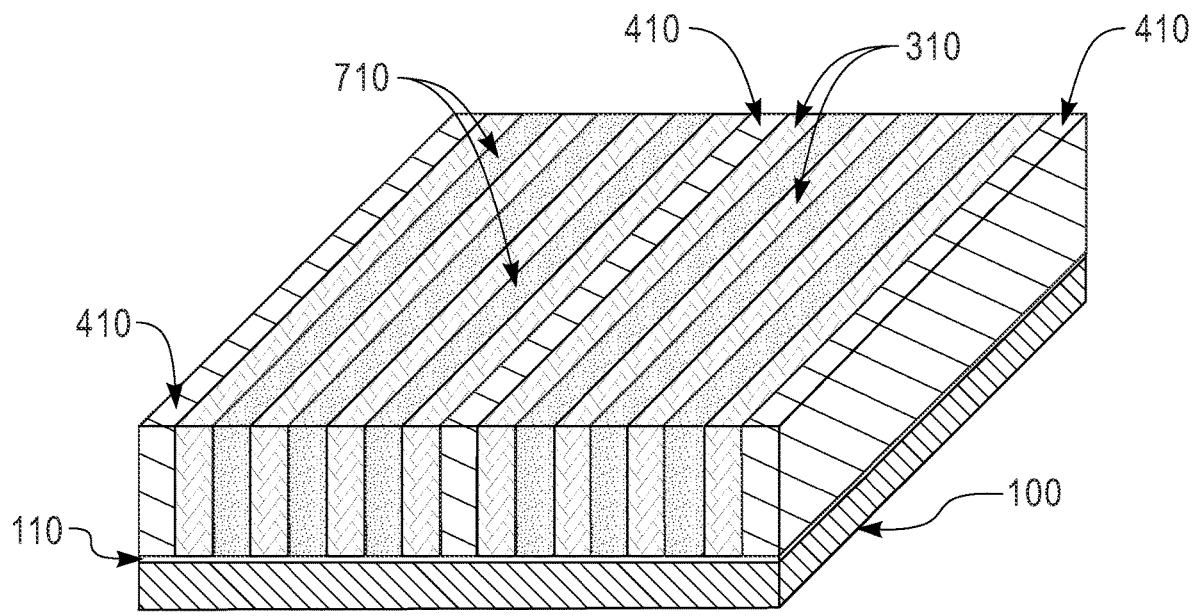
FIG. 7 depicts a process of forming conductive metal within existing gaps, in accordance with an embodiment of the invention.

FIG. 7 depicts an isometric view of fabrication steps, in accordance with an embodiment of the present invention. FIG. 7 shows the formation of conductive metal 710 within the gaps that comprise the first and second trenches. Conductive metal 710 may be any type of conductive metal. For example, conductive metal 710 may be composed of Ru, Co, molybdenum (Mo), tungsten (W), Al, or rhodium (Rh). Conductive metal 710 may be deposited using, for example, CVD, PECVD, PVD, or other deposition processes. Conductive metal 710 may be created by depositing conductive metal 710 above the desired height and subsequently utilizing a planarization process, such as CMP, to reduce the height of conductive metal 710 such that the top surfaces of spacers 310 and dielectric layer 410 are exposed.

In some embodiments, where spacers 310 are comprised of TiN, line wiggle may be reduced compared to other material usage. Embodiments of the present invention recognize that templates with higher modulus can mitigate post metal fill line wiggling. A TiN template, where spacers 310 are composed of TiN has a modulus of about 500 gigapascals (GPa), which is higher than many other materials.

Figure 8:
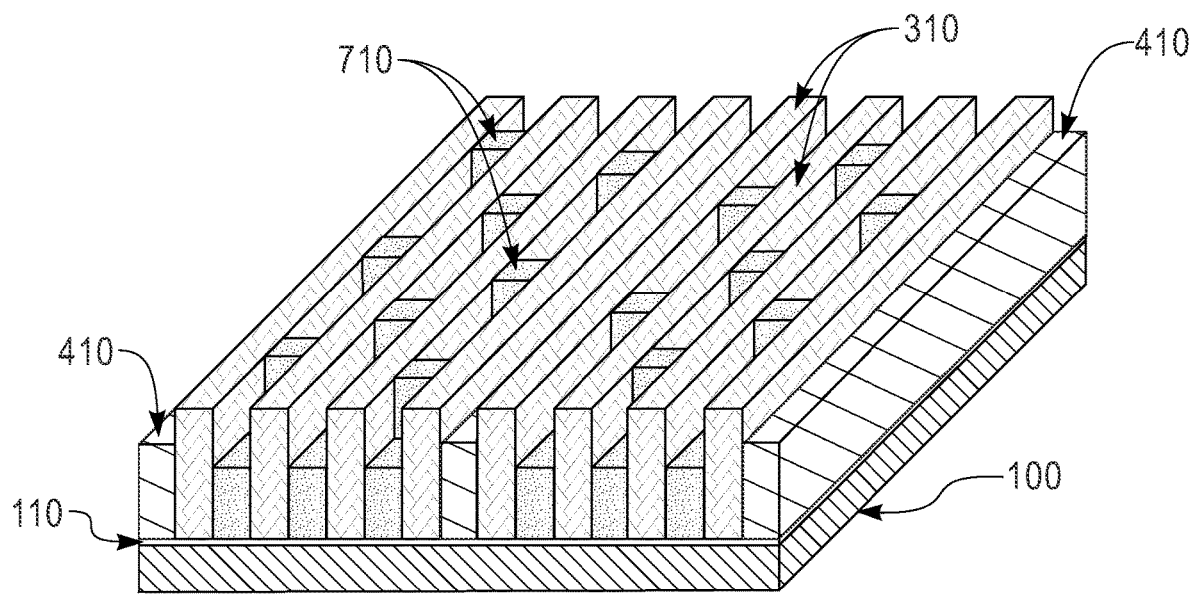
FIG. 8 depicts a process of forming a top via and metal interconnect line, in accordance with an embodiment of the invention.

FIG. 8 depicts an isometric view of fabrication steps, in accordance with an embodiment of the present invention. FIG. 8 shows the formation of a top via and metal interconnect line by subtractive patterning processes, during which non-via portions of conductive metal 710 are recessed to target depths for the desired via structure. The formation of the top via may be performed using photolithographic subtractive patterning processes. A masking step is utilized to form vias in conductive metal 710. Such masking may entail depositing a photoresist layer and patterning the layer using ultra-violet light, enabling removal of only selected portions of the photoresist, and then etching conductive metal 710 in accordance with the photoresist pattern. It shall be noted that the depicted arrangement of the vias in FIG. 8 (and subsequent similar figures) may vary based on implementation details of the final desired via structure. In some embodiments, a selective etching process may be utilized. In some embodiments, such as the embodiment depicted in FIG. 8, dielectric layer 410 may be damaged as a result of the etching process, which is represented in FIG. 8 by the reduced height of dielectric layer 410.

Figure 9:
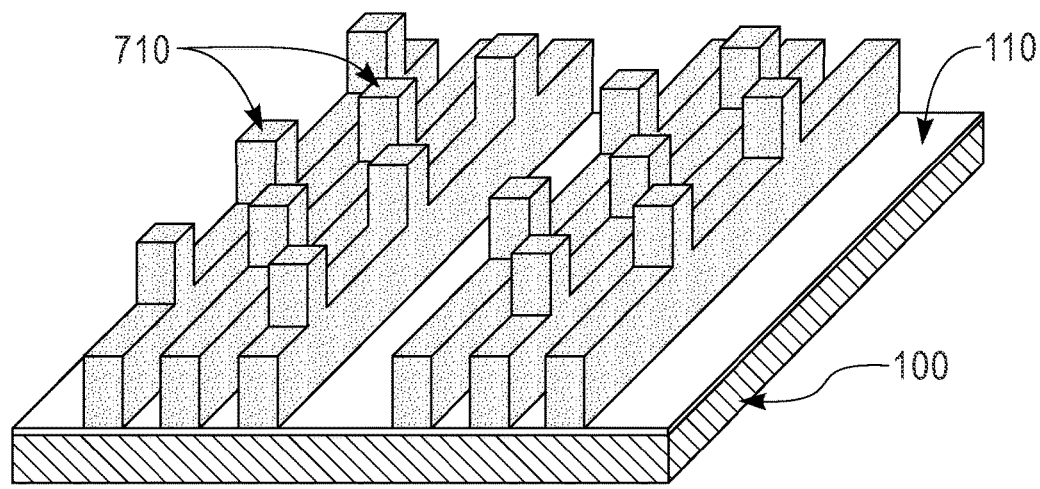
FIG. 9 depicts a process of removing remaining portions of the dielectric layer and the spacers, in accordance with an embodiment of the invention.

FIG. 9 depicts an isometric view of fabrication steps, in accordance with an embodiment of the present invention. FIG. 9 shows the selective removal of spacers 310 and dielectric layer 410 and a resulting via structure that includes one or more vias formed in conductive metal 710 and liner 110 on semiconductor substrate 100. Spacers 310 and dielectric layer 410 may be removed using an etching process that is selective in removing physically exposed portions of spacers 310 and/or dielectric layer 410 relative to conductive metal 710 to remove all of spacers 310 and dielectric layer 410 and expose portions of liner 110. The etching process utilized may be dry etching or wet etching process.

In some embodiments, exposed portions of liner 110 remain on semiconductor substrate 100. In other embodiments, exposed portions of liner 110 are etched away, such that liner 110 is only present under conductive metal 710 (see FIG. 16, where conductive metal 1310 is similar to conductive metal 710).

The resulting structure is a BEOL metal line and top via structure. The structure may be, for example, a metal-insulator-metal capacitor that includes metal lines formed by damascene and top vias formed by subtractive processes where spacers 310 act as scaffold during the top via etching process.

FIGS. 10-16 depict embodiments of the present invention that are formed according to a different fabrication process that begins with a trench etch.

Figure 10:
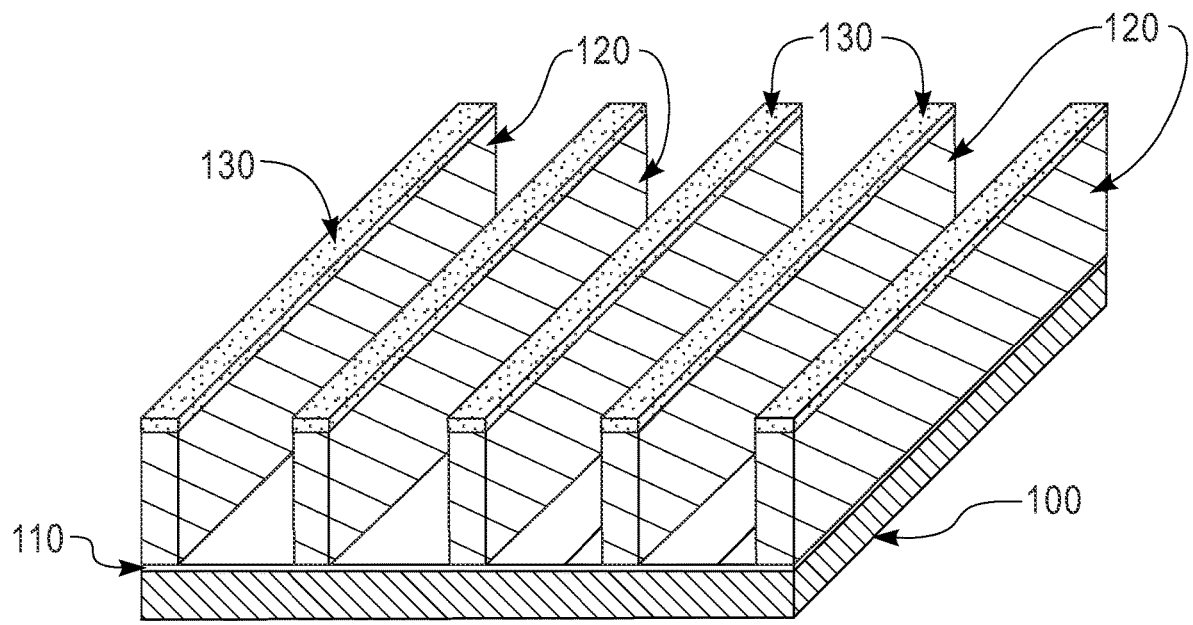
FIG. 10 depicts a process of creating trenches, in accordance with an embodiment of the invention.

The fabrication process depicted by FIG. 10 is performed on the same device originally depicted in FIG. 1, which, as previously described, depicts an isometric view of a device that includes a semiconductor material stack comprising hardmask 130, on dielectric layer 120, on liner 110, on semiconductor substrate 100.

FIG. 10 depicts an isometric view of fabrication steps, in accordance with an embodiment of the present invention. FIG. 10 shows the removal of portions of hardmask 130 and dielectric layer 120 to create trenches. The trenches may be formed by an etching process, such as RIE, laser ablation, or any etch process which can be used to selectively remove a portion of material, such as dielectric layer 120. Hardmask 130 may be patterned as depicted in FIG. 10, prior to performing the etching process, to aid in the creation of the trenches by preventing the remaining portions of dielectric layer 120 to be removed during the etching process. The etching process only removes the portions of dielectric layer 120 not protected by hardmask 130 and the etching process stops at liner 110. The trench width is selected based on a sum of the final desired metal line width and spacer thickness. In some embodiments, the trench width is equal to three times the final desired metal line width. The remaining portions of dielectric layer 120 may form dielectric material lines.

Figure 11:
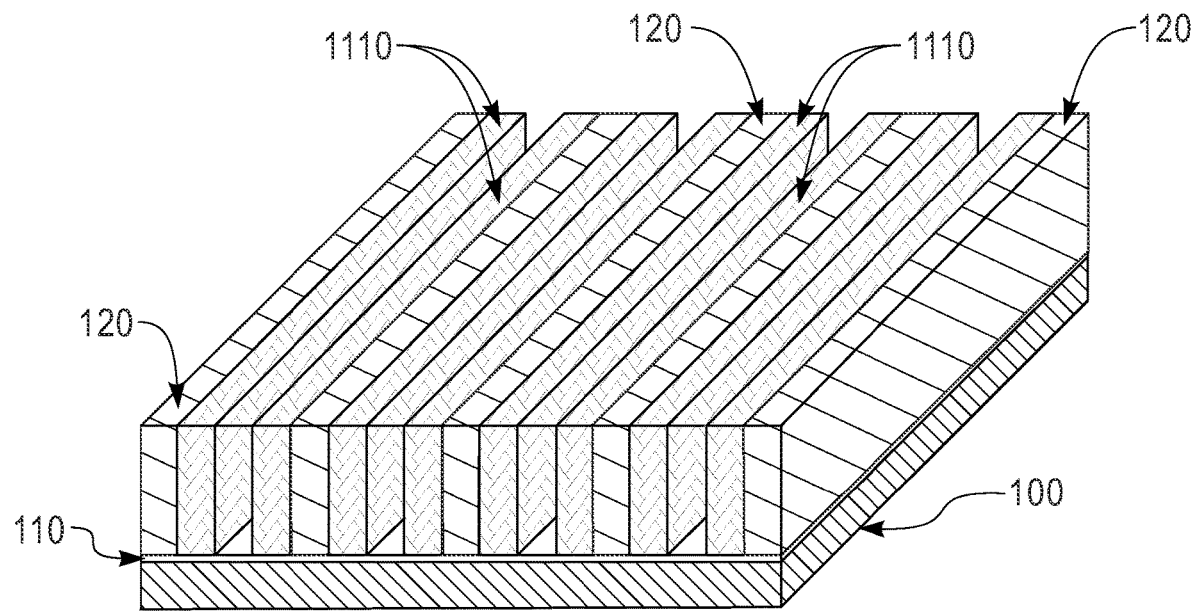
FIG. 11 depicts a process of forming spacers on sidewalls of exposed sides of the dielectric layer, in accordance with an embodiment of the invention.

FIG. 11 depicts an isometric view of fabrication steps, in accordance with an embodiment of the present invention. FIG. 11 shows the formation of spacers 1110 on the exposed sides of dielectric layer 120. Spacers 1110 are composed of metal (e.g., TiN, TaN) or any dielectric spacer material including, for example, a dielectric oxide, dielectric nitride, and/or dielectric oxynitride. In some embodiments, spacers 1110 are composed of a non-conductive low-capacitance dielectric material such as silicon dioxide ($SiO_2$). In general, spacers 1110 are composed of a material different from liner 110. The process of forming spacers 1110 may include depositing a conformal layer (not shown) of insulating material, such as silicon nitride, over exposed surfaces of liner 110 and mandrels dielectric layer 120. Spacers 310 can be deposited using, for example CVD, plasma enhanced chemical vapor deposition (PECVD), physical vapor deposition (PVD), or other deposition processes. An anisotropic etch process, where the etch rate in the forward direction is greater than the etch rate in the lateral directions, may be used to remove portions of the insulating layer, thereby forming spacers 1110 located on the sidewalls of dielectric layer 120, as depicted in FIG. 11.

FIG. 11 also depicts the removal of hardmask 130. In general, the process of removing hardmask 130 involves the use of an etching process such as RIE, laser ablation, or any etch process which can be used to selectively remove a portion of material, such as hardmask 130.

Figure 12:
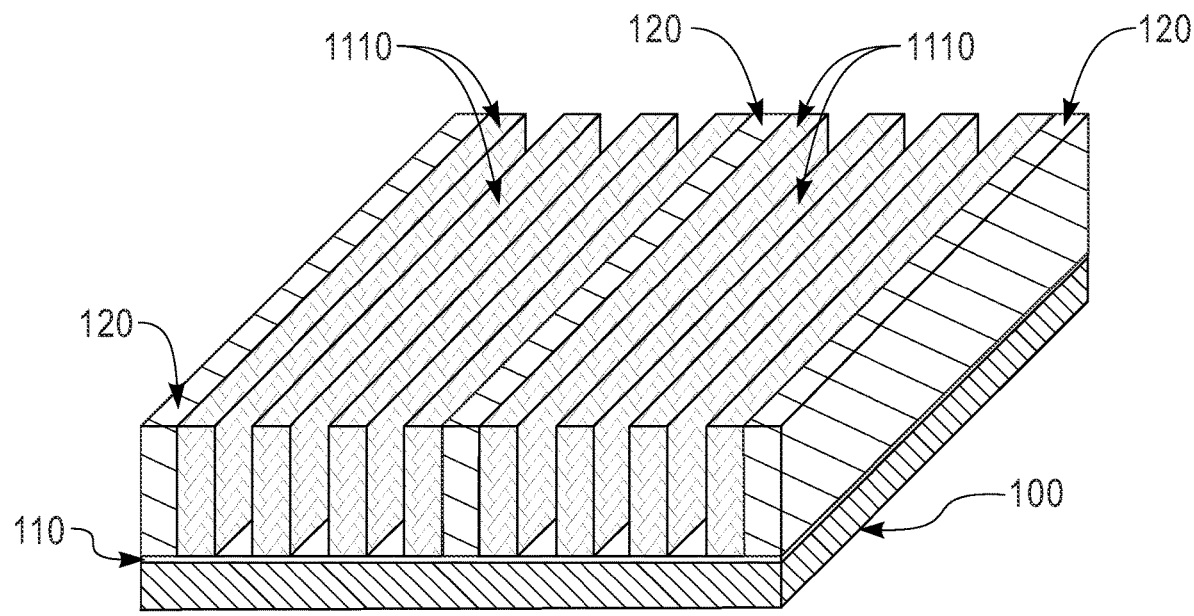
FIG. 12 depicts a process of removing dielectric material lines, in accordance with an embodiment of the invention.

FIG. 12 depicts an isometric view of fabrication steps, in accordance with an embodiment of the present invention. FIG. 12 shows the removal of portions of dielectric layer 120 to create a second trench. In the depicted embodiment, the middle and end portions of dielectric layer 120 are not removed. The portion of dielectric layer 120 that are removed may be removed by the use of a standard photolithographic process to define the desired shape of the second trench in a layer of photoresist (not shown) deposited on the top surface of spacers 1110, dielectric layer 120, and/or liner 110. In various embodiments, standard photolithographic processes are used to remove a portion of the photoresist layer corresponding to the areas of dielectric layer which are to be removed in the formation of the second trench. The portion or dielectric layer 120 may be removed using, for example, a dry etch process such as RIE to remove the desired portion(s) of dielectric layer 120. As a result of etching the portions of dielectric layer 120, liner 110 is exposed in the area defined as the second trench.

Figure 13:
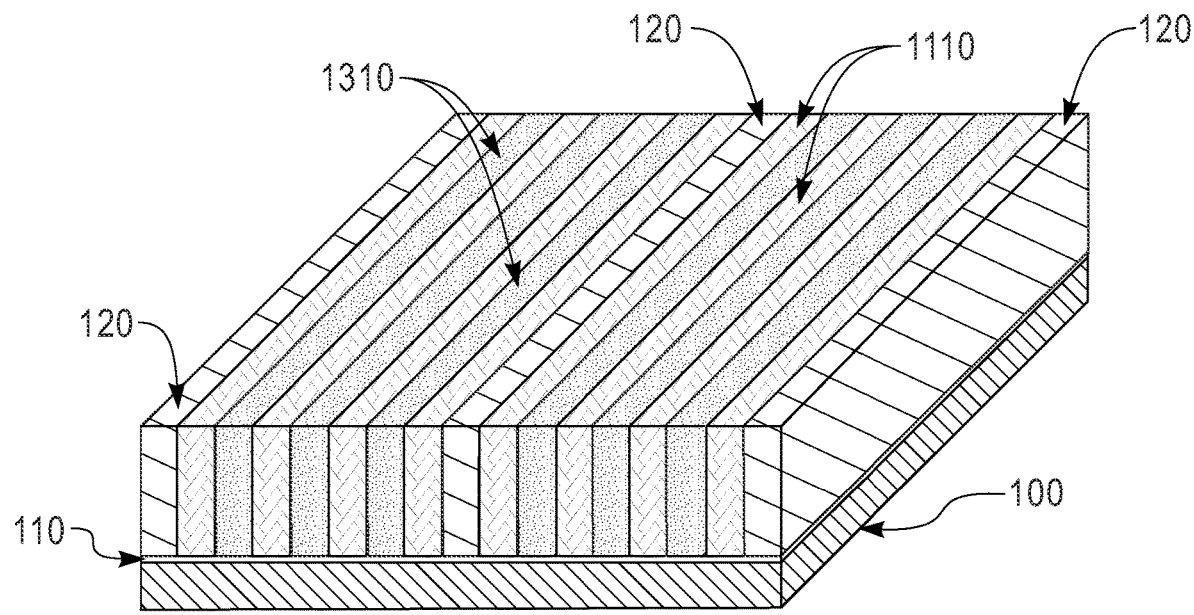
FIG. 13 depicts a process of forming conductive metal within existing gaps, in accordance with an embodiment of the invention.

FIG. 13 depicts an isometric view of fabrication steps, in accordance with an embodiment of the present invention. FIG. 7 shows the formation of conductive metal 1310 within the gaps that comprise the trenches. Conductive metal 1310 may be any type of conductive metal. For example, conductive metal 710 may be composed of Ru, Co, Mo, W, Al, or Rh. Conductive metal 1310 may be deposited using, for example, CVD, PECVD, PVD, or other deposition processes. Conductive metal 1310 may be created by depositing conductive metal 1310 above the desired height and subsequently utilizing a planarization process, such as CMP, to reduce the height of conductive metal 1310 such that the top surfaces of spacers 1110 and dielectric layer 120 are exposed.

In some embodiments, where spacers 1110 are comprised of TiN, line wiggle may be reduced compared to other material usage. Embodiments of the present invention recognize that templates with higher modulus can mitigate post metal fill line wiggling. A TiN template, where spacers 1110 are composed of TiN has a modulus of about 500 GPa, which is higher than many other materials.

Figure 14:
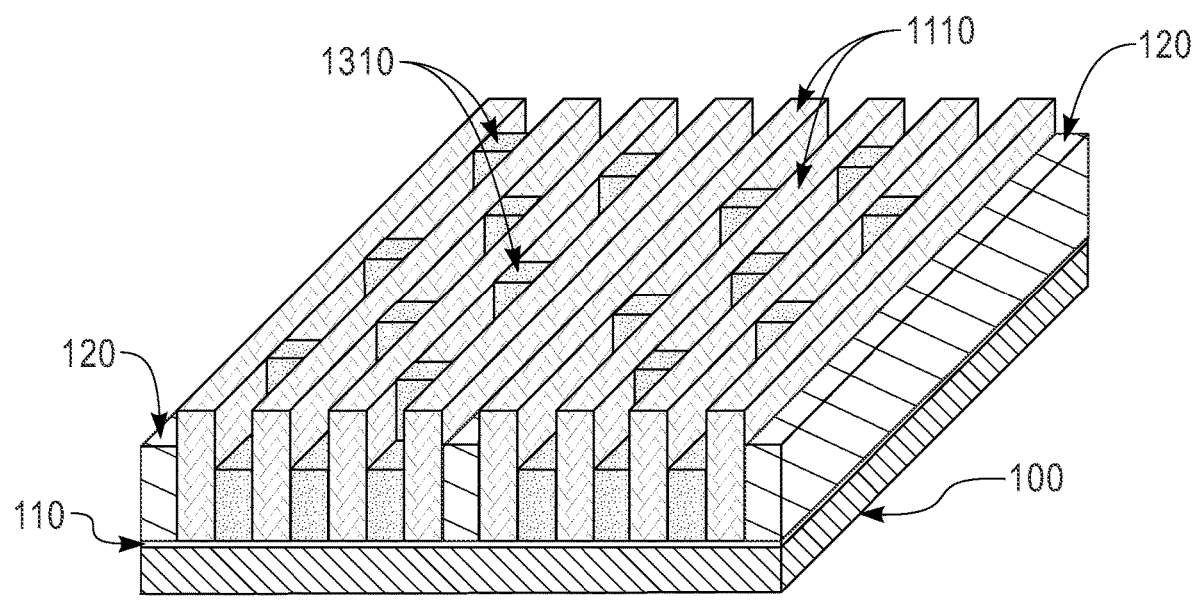
FIG. 14 depicts a process of forming a top via and metal interconnect line, in accordance with an embodiment of the invention.

FIG. 14 depicts an isometric view of fabrication steps, in accordance with an embodiment of the present invention. FIG. 14 shows the formation of a top via and metal interconnect line by subtractive patterning processes, during which non-via portions of conductive metal 1310 are recessed to target depths for the desired via structure. The formation of the top via may be performed using photolithographic subtractive patterning processes. A masking step is utilized to form vias in conductive metal 1310. Such masking may entail depositing a photoresist layer and patterning the layer using ultra-violet light, enabling removal of only selected portions of the photoresist, and then etching conductive metal 1310 in accordance with the photoresist pattern. It shall be noted that the depicted arrangement of the vias in FIG. 14 (and subsequent similar figures) may vary based on implementation details of the final desired via structure. In some embodiments, a selective etching process may be utilized. In some embodiments, such as the embodiment depicted in FIG. 14, dielectric layer 120 may be damaged as a result of the etching process, which is represented in FIG. 14 by the reduced height of dielectric layer 120.

Figure 15:
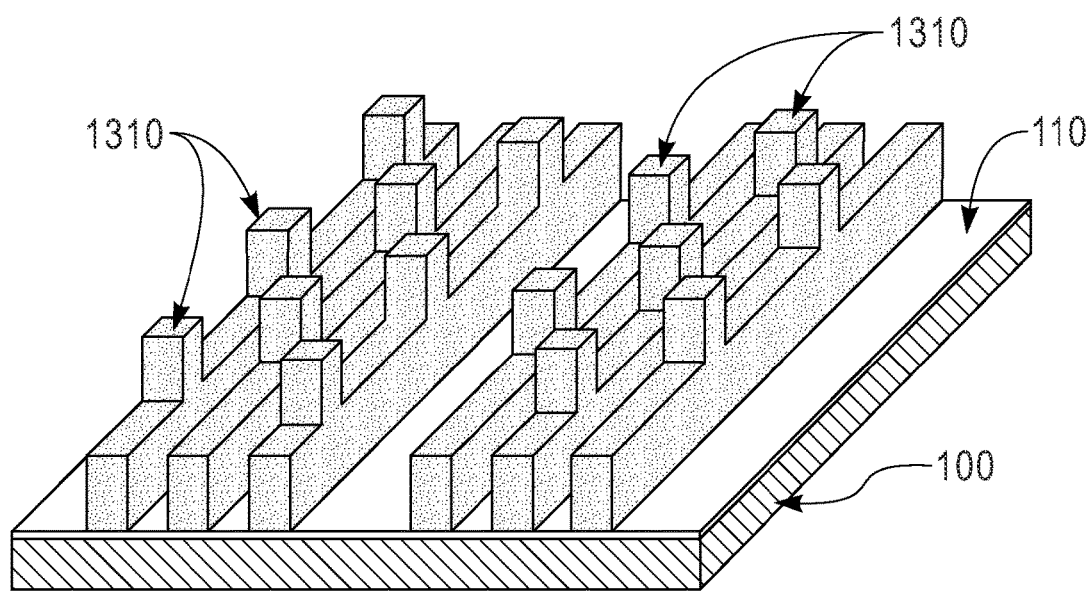
FIG. 15 depicts a process of removing remaining portions of the dielectric layer and the spacers, in accordance with an embodiment of the invention.

FIG. 15 depicts an isometric view of fabrication steps, in accordance with an embodiment of the present invention. FIG. 15 shows the selective removal of spacers 1110 and dielectric layer 120 and a resulting via structure that includes one or more vias formed in conductive metal 1310 and liner 110 on semiconductor substrate 100. Spacers 1110 and dielectric layer 120 may be removed using an etching process that is selective in removing physically exposed portions of spacers 1110 and/or dielectric layer 120 relative to conductive metal 1310 to remove all of spacers 1110 and dielectric layer 120 and expose portions of liner 110. The etching process utilized may be dry etching or wet etching process.

In some embodiments, exposed portions of liner 110 remain on semiconductor substrate 100. In other embodiments, exposed portions of liner 110 are etched away, such that liner 110 is only present under conductive metal 1310 (see FIG. 16).

Figure 16:
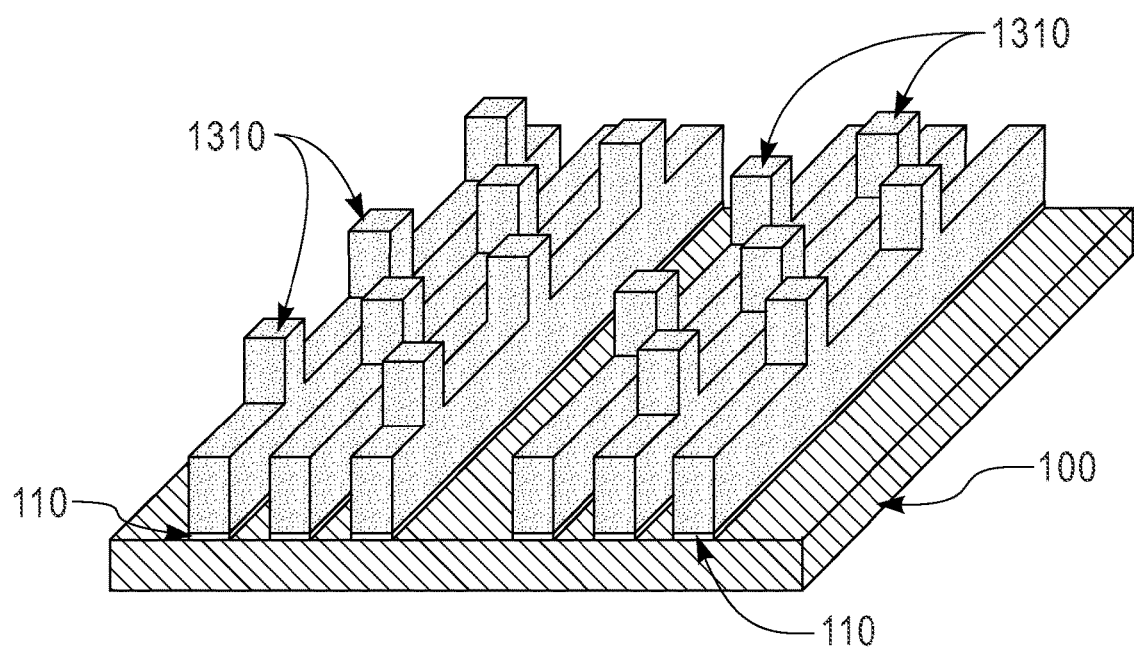
FIG. 16 depicts a process of removing exposed portions of the liner, in accordance with an embodiment of the invention.

FIG. 16 depicts an isometric view of fabrication steps, in accordance with an embodiment of the present invention. FIG. 15 shows the selective removal of exposed portions of liner 110. Liner 110 is removed using etching techniques such as, RIE. RIE uses chemically reactive plasma, generated by an electromagnetic field, to remove various materials. A person of ordinary skill in the art will recognize that the type of plasma used will depend on the material of which liner 110 is composed, or that other etch processes such as wet chemical etching or laser ablation may be used. In one embodiment, chemical etching is used to remove exposed portions of liner 110 and expose the surface of semiconductor substrate 100. In some embodiments, TiN and TaN wet removal processes may be utilized to remove exposed portions of liner 110, such as, for example, when liner 110 is composed of TiN or TaN.

The resulting structure is a BEOL metal line and top via structure. The structure may be, for example, a metal-insulator-metal capacitor that includes metal lines formed by damascene and top vias formed by subtractive processes where spacers 310 act as scaffold during the top via etching process.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
   patterning mandrels on a liner, wherein the liner is located on a semiconductor substrate;
   forming spacers on sidewalls of the mandrels;
   forming dielectric material lines on exposed surfaces of the liner and within a plurality of gaps between the spacers;
   removing the mandrels;
   removing at least one of the dielectric material lines within at least one of the plurality of gaps between the spacers;
   forming conductive metal within each gap;
   patterning the conductive metal to form metal interconnect lines and vias; and
   removing the plurality of spacers and the remaining dielectric material lines.

2. The method of claim 1, wherein forming the dielectric material layer on the exposed portions of the liner comprises:
   depositing dielectric material to a height above the mandrels, via a process selected form the group consisting of: spin-on-glass and flowable chemical vapor deposition; and
   reducing the height of the dielectric material to form the dielectric material layer and expose a top surface of the mandrels utilizing a planarization process.

3. The method of claim 1, wherein the spacers are composed of titanium nitride (TiN).

4. The method of claim 1, wherein the conductive metal is selected from the group consisting of: ruthenium (Ru), molybdenum (Mo), cobalt (Co), aluminum (Al), tungsten (W), and rhodium (Rh).

5. The method of claim 1, further comprising:
   subsequent to removing the plurality of spacers and the remaining dielectric material lines, removing exposed portions of the liner.

6. The method of claim 1, wherein the at least one of the dielectric material lines comprises a plurality of the dielectric material lines.

7. The method of claim 1, wherein patterning the conductive metal to form the metal interconnect lines and the vias utilizes a subtractive patterning process.

8. A method comprising:
providing a dielectric layer located on a liner, wherein the liner is located on a surface of a semiconductor substrate;
forming a plurality of trenches of a depth that exposes a surface of the liner and creates dielectric material lines from the remaining dielectric layer;
forming spacers on sidewalls of the dielectric material lines, wherein a first gap is present between two of the spacers;
removing at least one of the dielectric material lines that is between two of the spacers, creating at least a second gap;
forming conductive metal within each gap, including at least the first gap and the second gap, present between the spacers;
patterning the conductive metal to form metal interconnect lines and vias; and
removing the spacers and the remaining dielectric material lines.

9. The method of claim 8, wherein a width of the trench is equal to a sum of a desired metal interconnect line width and expected spacer thickness.

10. The method of claim 8, wherein a width of the trench is three times greater than a desired metal interconnect line width.

11. The method of claim 8, wherein the spacers are composed of titanium nitride (TiN).

12. The method of claim 8, wherein the conductive metal is selected from the group consisting of: ruthenium (Ru), molybdenum (Mo), cobalt (Co), aluminum (Al), tungsten (W), and rhodium (Rh).

13. The method of claim 8, further comprising:
subsequent to removing the spacers and the remaining dielectric material lines, removing exposed portions of the liner.

14. The method of claim 8, wherein patterning the conductive metal to form the metal interconnect lines and the vias utilizes a subtractive patterning process.

* * * * *